United States Patent [19]

Owens

[11] 4,157,505

[45] Jun. 5, 1979

[54] PLURAL BAND SCANNING RADIO WITH DIRECT SWITCH OF RF AMPLIFYING TRANSISTORS

[75] Inventor: Kenneth R. Owens, Indianapolis, Ind.

[73] Assignee: Regency Electronics, Indianapolis, Ind.

[21] Appl. No.: 805,839

[22] Filed: Jun. 13, 1977

[51] Int. Cl.² ............................................. H04B 1/32
[52] U.S. Cl. ...................................... 325/470; 325/459
[58] Field of Search ............... 325/458, 459, 464, 468, 325/470, 469

[56] References Cited

U.S. PATENT DOCUMENTS

| | | |
|---|---|---|
| 3,824,475 | 7/1974 | Pflasterer .............................. 325/470 |
| 3,895,303 | 7/1975 | Imazeki et al. ...................... 325/470 |
| 3,940,697 | 2/1976 | Morgan ................................ 325/470 |
| 3,996,521 | 12/1976 | Owens ................................. 325/470 |
| 3,996,522 | 12/1976 | Koch et al. .......................... 325/470 |
| 4,000,470 | 12/1976 | Okada .................................. 325/470 |

Primary Examiner—Robert L. Griffin
Assistant Examiner—Jin F. Ng
Attorney, Agent, or Firm—Woodard, Weikart, Emhardt & Naughton

[57] ABSTRACT

A signal-seeking radio receiver is disclosed which can be manually programmed to receive a number of different channels in any combination with three bands with a minimum of switching circuitry. The receiver has pre-IF circuitry which includes at least one PNP transistor associated with each band, the base terminal of each transistor being connectable to one output of a solid state counter for controlling the band of operation of the receiver.

19 Claims, 8 Drawing Figures

PLURAL BAND SCANNING RADIO WITH DIRECT SWITCH OF RF AMPLIFYING TRANSISTORS

BACKGROUND OF THE INVENTION

1. Field of the Invention

This invention relates in general to signal-seeking radio receivers, and in particular, to stepping radio receivers for production of audio signals from radio frequency signals, which receivers are capable of tuning to several separate channels on a plurlity of bands.

2. Description of the Prior Art

The invention disclosed and claimed herein can be considered to be an improvement on the inventions of U.S. Pat. No. 3,665,318 to Hoffman et al. and U.S. Pat. No. 3,996,521 to Owens. In prior art patents, such as the Hoffman et al. and Owens patents, band selection switch circuitry which connects to the band-selecting means precedes the RF amplifier and mixer circuitry. When a band is selected by means of a patch panel or patch board technique, and a particular channel is being scanned, a low signal biases the base of a band switch transistor turning on the transistor and causing biasing current to be supplied from a constant DC voltage source to a pair of biasing resistors which in turn condition the RF amplifier and band mixer for the particular band to be conditioned for operation.

The presence of the band switch circuitry as part of these prior art radio receivers represents additional time for fabrication of the radio receiver as well as additional costs associated with the required components. Furthermore, the greater the number of parts, the greater the chances for failure of the radio. Reduction in the amount of circuitry which manifests itself in fewer component parts and fewer connections will have the advantages of lower cost and improved reliability.

Other circuits for band selection in radio receivers are disclosed in U.S. Pat. No. 3,895,303 to Imazeki et al. and U.S. Pat. No. 3,940,697 to Morgan. However, the arrangement of Imazeki et al. is only designed for two bands and the circuitry is not usable with the multiband arrangement of Owens. The invention of Morgan employs a single mixer associated with a plurality of RF amplifier sections. The band switching in Morgan is accomplished through circuit components which either merely switch the signals on and off but do not amplify the incoming signal or require a plurality of stages which invert the polarity of the control signal.

SUMMARY OF THE INVENTION

One embodiment of the present invention relates to an improved multiband stepping radio receiver comprising a pre-IF section having a plurality of switchable transistor amplifiers, stepping means having several outputs and programmable band-selecting means. There is at least one switchable transistor amplifier, through which pre-IF, RF signals pass, associated with each band. The several outputs of the stepping means have means for producing a low impedance to a common supply lead for the output which is "on" and a high impedance or a high voltage with respect to the same common supply lead for the outputs which are "off."
The programmable band-selecting means provides a current path for one of the switchable transistor amplifiers which passes through the low impedance output of the stepping means. The selection of one of the switchable transistor amplifiers is made by the programmable band-selecting means.

The use of a switchable transistor amplifier in the pre-IF section and a current path through a low impedance output of the stepping means which is selected by the band-selecting means permits band selection and mixer operation without the need for separate band switch or signal inverting circuitry.

It is therefore an object of the invention to provide a multiband stepping radio receiver which is more economical and more compact than prior art receivers.

Related objects and advantages of the present invention will be apparent from the following description.

DESCRIPTION OF THE PREFERRED EMBODIMENT

Figure 1:
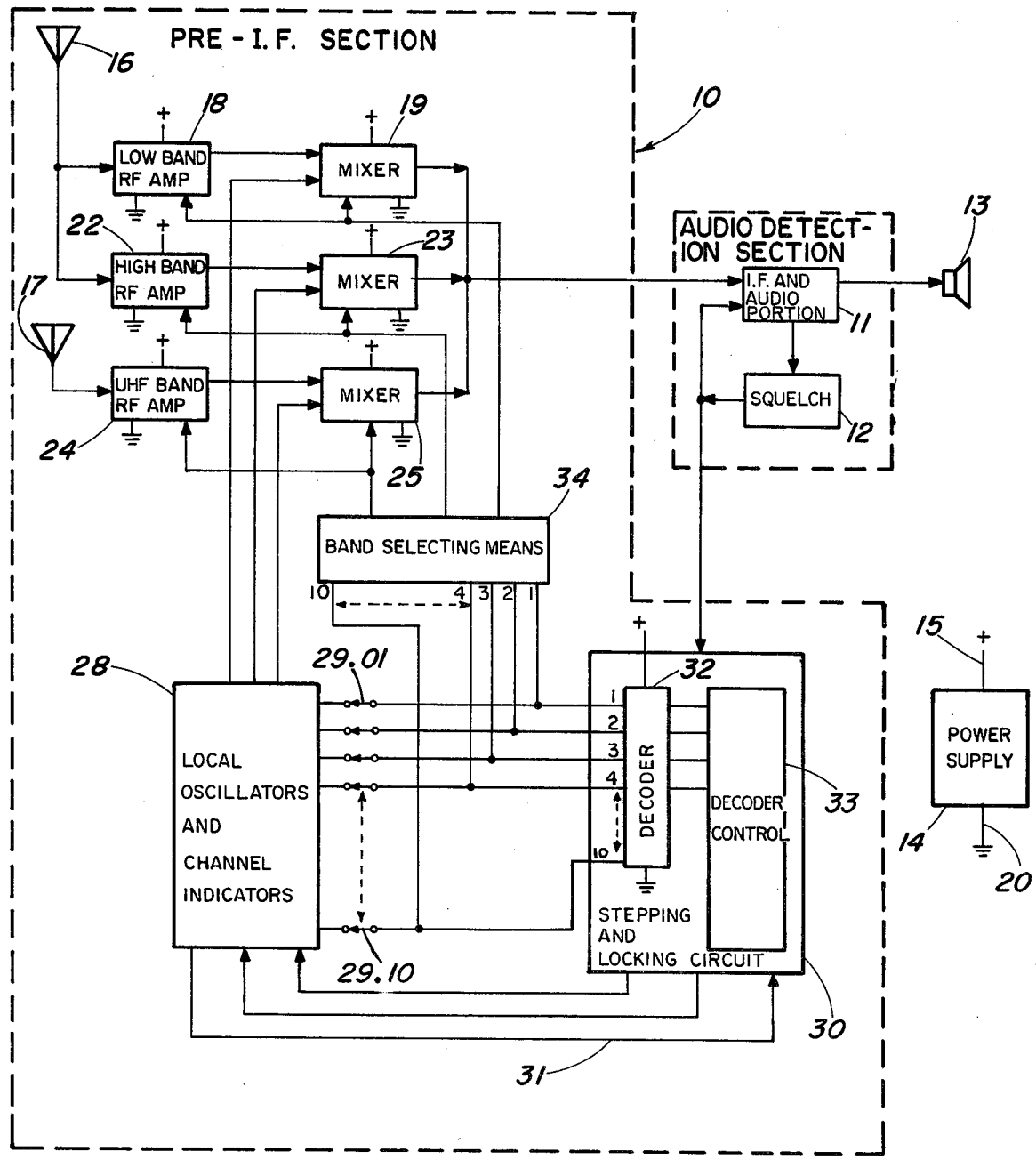
FIG. 1 is a block diagram illustrating the preferred embodiment of a stepping radio receiver according to the present invention.

Referring to FIG. 1 there is illustrated a block diagram of the preferred embodiment of a stepping radio receiver according to the present invention. The receiver is designed for production of audio signals from audio modulated radio frequency signals and would normally operate on three bands to receive FM signals thereon. The bands of operation are the low band VHF, high band VHF and UHF band. The receiver includes a pre-IF section 10 and audio detection means which includes IF and audio portion 11, squelch circuit 12, speaker 13 and power supply 14. Power supply 14 has two common supply leads 15 and 20 at a positive 8.2 volts and a ground potential, respectively. These leads are coupled to other portions of the receiver circuitry as indicated. The squelch circuit 12 is a noise squelch circuit which functions conventionally to prevent production of an audio signal when an RF signal is not being received. The pre-IF section 10 includes antenna 16 which functions to receive low band and high band VHF signals and antenna 17 which functions to receive UHF band signals. The antenna 16 connects to low band RF amplifier 18 which is illustrated in greater detail in FIG. 5. The output of low band RF amplifier 18 connects to mixer 19. Low band RF amplifier 18 and antenna 16 function as an RF signal-receiving means for producing a sufficient RF signal level at low band VHF frequencies for the circuitry of mixer 19.

Figure 6:
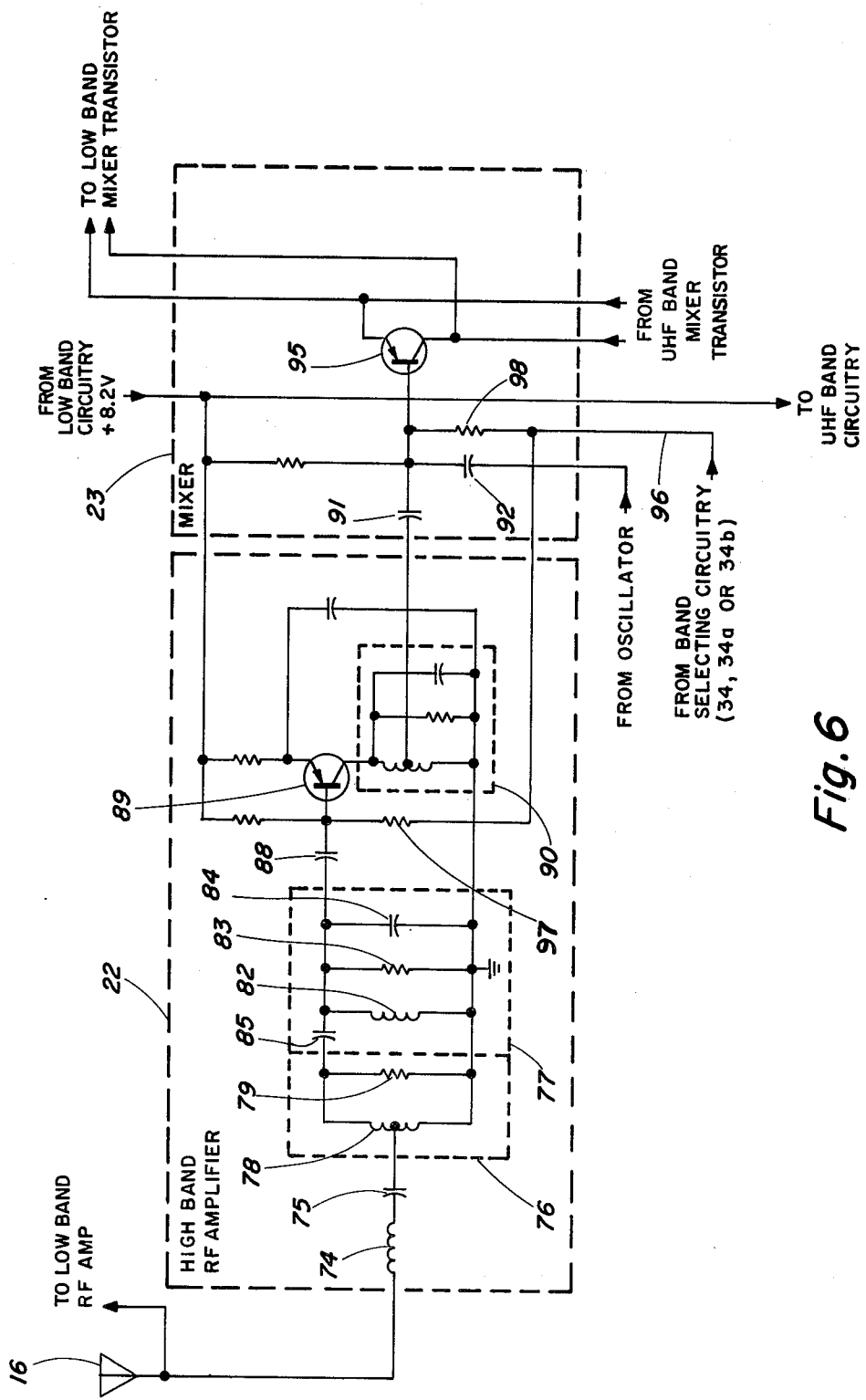
FIG. 6 is a circuit diagram of the high band RF amplifier and mixer circuits of FIG. 1.

Similarly for the high band, there is a high band RF amplifier 22 and a mixer 23 both of which are illustrated in greater detail in FIG. 6. The high band RF amplifier 22 and antenna 16 function as an RF signal-receiving means for providing an RF signal level at high band VHF frequencies for the circuitry of mixer 23.

Figure 7:
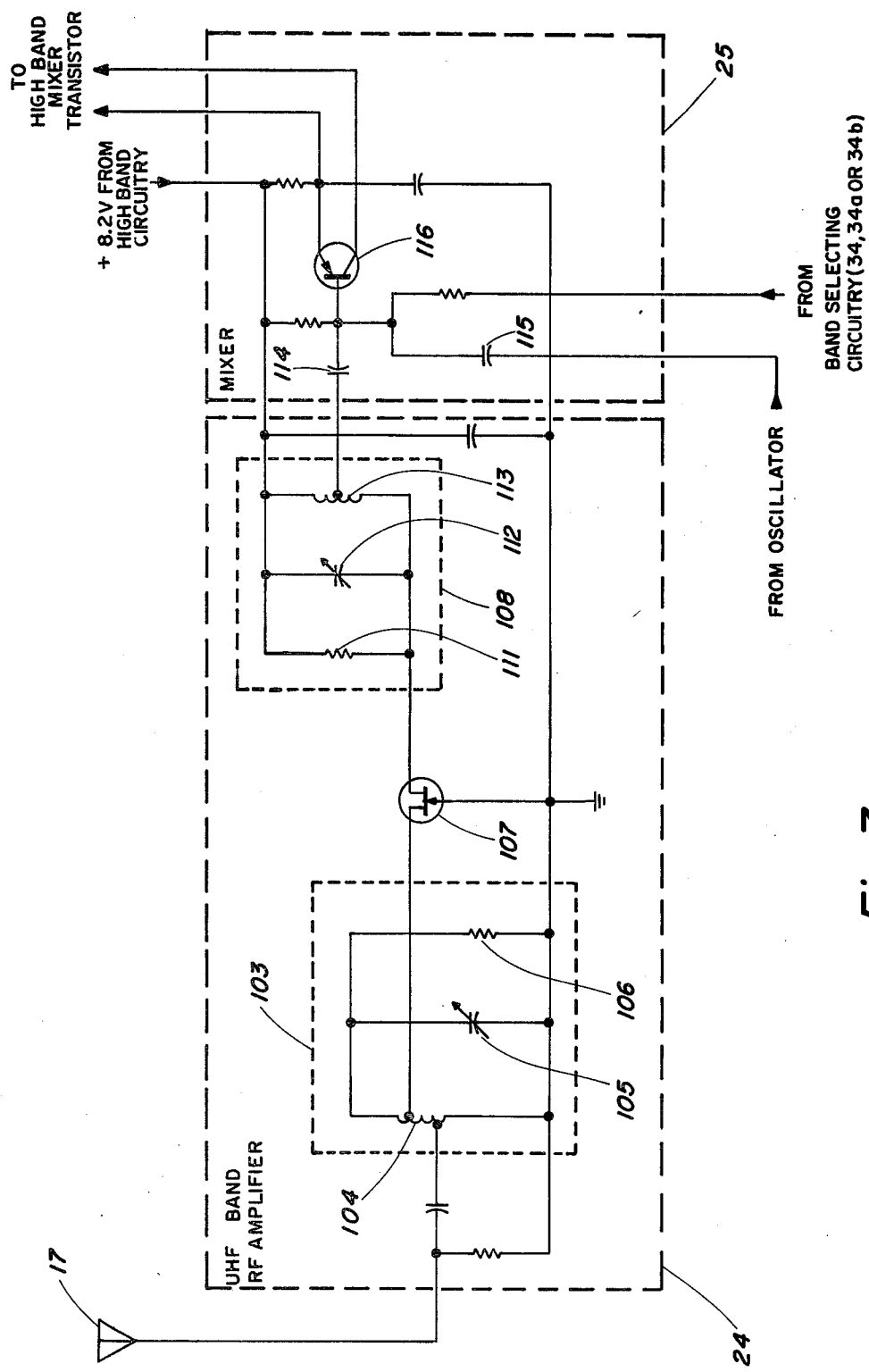
FIG. 7 is a circuit diagram of the UHF band RF amplifier and mixer circuits of FIG. 1.

UHF band RF amplifier 24 and antenna 17 as are illustrated in greater detail in FIG. 7, function to provide UHF band signals of sufficient strength for mixer 25. The injection frequencies for mixers 19, 23 and 25 are obtained from the local oscillators and channel indicator circuit 28 in a conventional manner such as disclosed by U.S. Pat. No. 3,824,475 issued July 16, 1974 to Pflasterer which is hereby incorporated by reference.

Individual switches 29.01 to 29.10 control the individual channels. There are illustrated only five switches but these are shown as spanning a total of ten switches. For drawing clarity, switches 29.05 to 29.09 are not shown. Nevertheless, it is to be understood that all ten switches operate in a similar manner and a description of the operation of those switches shown in is applicable to all ten switches. It may be assumed that the switches are numerically designated by consecutive 0.01 decimal increments from 29.01 to 29.10 and similarly wherever there is a group of nine or ten similar elements, only one integer item number will be given and decimal point notation will be used for the number of the element within the group of nine or ten.

When any one of the ten switches 29.01 and 29.10 are open, the channel corresponding to that switch is rendered inoperative and the channel indicator (not shown) is correspondingly rendered inoperative. This can be sensed by circuitry in the local oscillators and channel indicator circuit 28 and caused to change the rate of stepping of the stepping and locking circuit 30 by connection thereto through sense line 31. Local oscillators and channel indicator circuit 28 includes a local oscillator which may be of conventional design such as is shown in U.S. Pat. No. 3,824,475, but preferably is of a type as disclosed by U.S. Pat. No. 3,996,522 issued Dec. 7, 1976 to Koch et al. which is hereby incorporated by reference. The oscillator provides injection frequencies for the mixers 19, 23 and 25, there being one frequency for each channel for which the receiver can tune. Stepping and locking circuit 30 includes a decoder 32 and a decoder control portion 33 coupled to the decoder. A suitable decoder for this application is a Motorola integrated circuit 74145.

The stepping and locking circuit 30 is of a type that is disclosed by U.S. Pat. No. 3,996,522 to Koch et al. The operation of stepping and locking circuit 30 is such that only one of its outputs 1 through 10 is "ON" at a given time and the outputs normally sequence in order from 1 through 10 and then begins again at 1. When a particular output of stepping and locking circuit 30 is "ON" a low impedance is produced to a common supply lead (which in this case is an electrical ground). Similarly, the other nine outputs which are "OFF" produce a high impedance to the same common supply lead, electrically appearing much like an open circuit. Alternative decoders could be used which would produce a high voltage when "OFF" and a ground potential voltage when "ON." The stepping and locking circuit 30 is defeatable by action of the squelch circuit 12. This action defeats the stepping as long as an RF signal is being received and allows resumption of automatic stepping when no signal is being received.

It can be observed that outputs 1 through 10 of stepping and locking circuit 30 connect not only to switches 29.01 to 20.10 but additionally to programmable, band-selecting circuitry 34 which is described in greater detail below.

Figure 2:
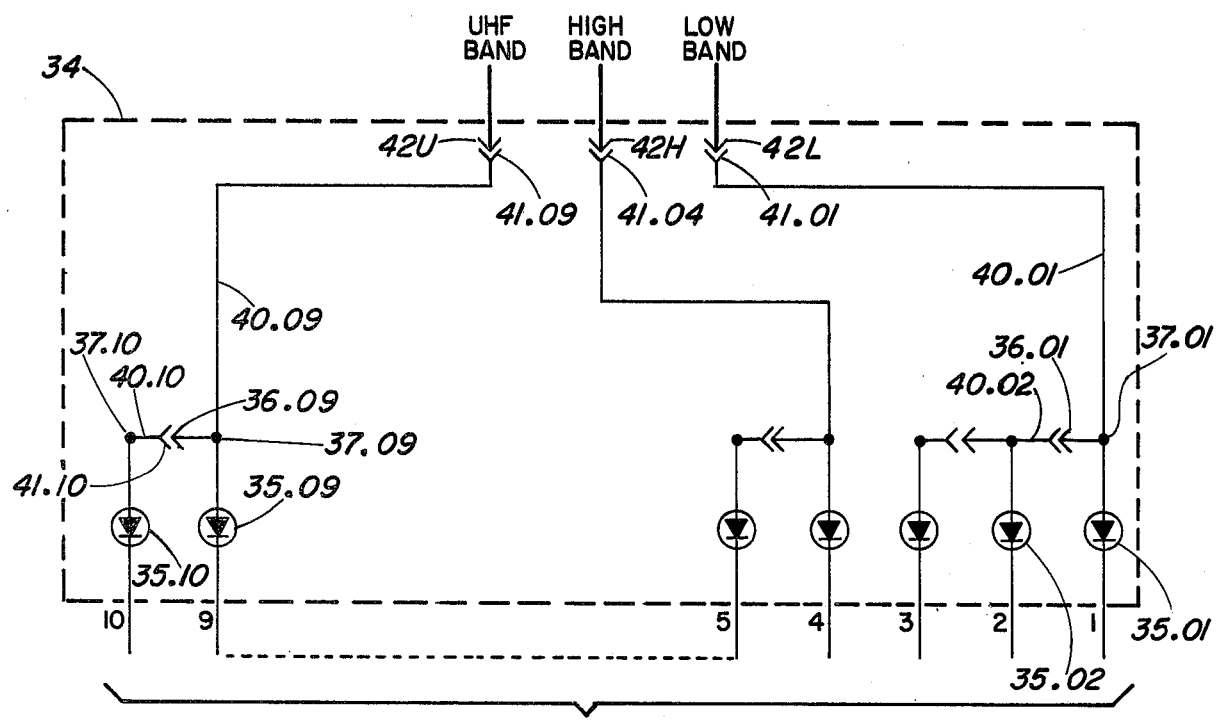
FIG. 2 is a schematic diagram of band-selecting means associated with the FIG. 1 radio receiver.

Referring to FIG. 2, it can be observed that outputs 1 through 10 of stepping and locking circuit 30 in addition to connecting to switches 29.01 to 29.10, also connect through diodes 35.01 to 35.10 to pins 36.01 through 36.09 (except output 10) and to ends 37.01 to 37.10 of wires 40.01 to 40.10. It can be noted that output 10 connects only through diode 35.10 to the end 37.10 of wire 40.10 and not to any pin connector as do all the other outputs. Each of the wires 40.01 to 40.10 have connected on one end a connecting element 41.01 to 41.10 which is of a design which permits it to mate with any one of the pins 36.01 to 36.09. Also present as part of band-selecting circuitry 34 are three pins 42L, 42H and 42U, designating the low band, high band and UHF band, respectively. These three pins are of identical design to pins 36.01 to 36.09 and are used to carry the signals which determine which bands are operative. Pin 42L connects to the low band RF amplifier 18 and its corresponding mixer 19. When pin 42L is grounded, the low band RF amplifier 18 and mixer 19 are caused to become operative and tuned to the low band (30–50 MHz). Correspondingly, grounding pin 42H will cause the high band RF amplifier 22 and mixer 23 to become operative and tuned to the high band (150–174 MHz). In a similar manner pin 42U functions to control the UHF band circuitry (450–512 MHz).

Figure 3:
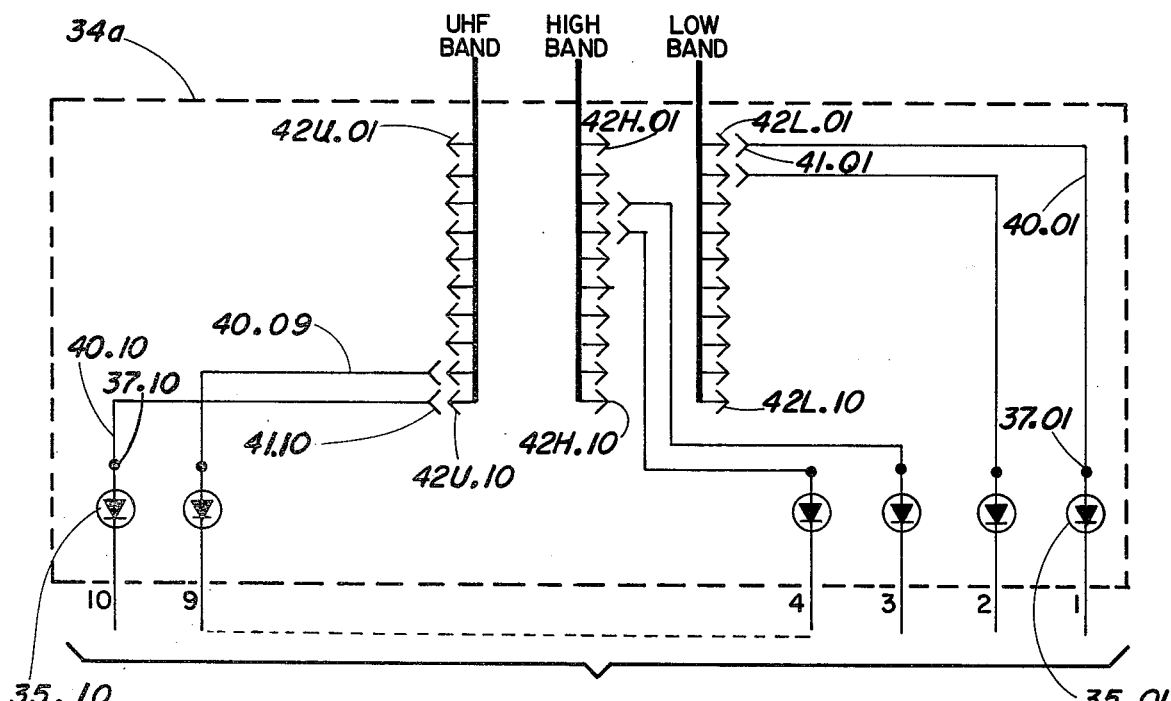
FIG. 3 is a schematic diagram of an alternate form of band-selecting means appropriate for use with the FIG. 1 radio receiver.

An alternate form for the band-selecting circuitry, although possibly not as convenient as what has been described, is shown by FIG. 3 and is identified as 34a. The arrangement is similar to what has been described for band-selecting circuitry 34. However, rather than having a single pin 42 associated with each band, circuitry 34a includes a series of pins 42L.01 to 42L.10 for the low band, and corresponding pins for the other two bands. Furthermore, pins 36.01 to 36.09 are not used with circuitry 34a. Instead, connecting elements 41.01 to 41.10 are on the ends of wires 40.01 to 40.10 and mate with one of the pins 42L.01 to 42L.10 or 42H or 42U in order to place a particular channel on a particular band. As shown in FIG. 3, channels 1 and 2 have been placed on the low band by mating the connecting elements 41.01 and 41.02 with pins 42L.01 and 42L.02, respectively. Any connecting element 41.01 to 41.10 will mate with any of the pins 42. By making connections which correspond numerically (element 41.01 onto pin 42L.01 or 42H.01 or 42U.01), the connections will identify what channels are on what bands and the entire selection process will be in an orderly fashion.

Figure 4:
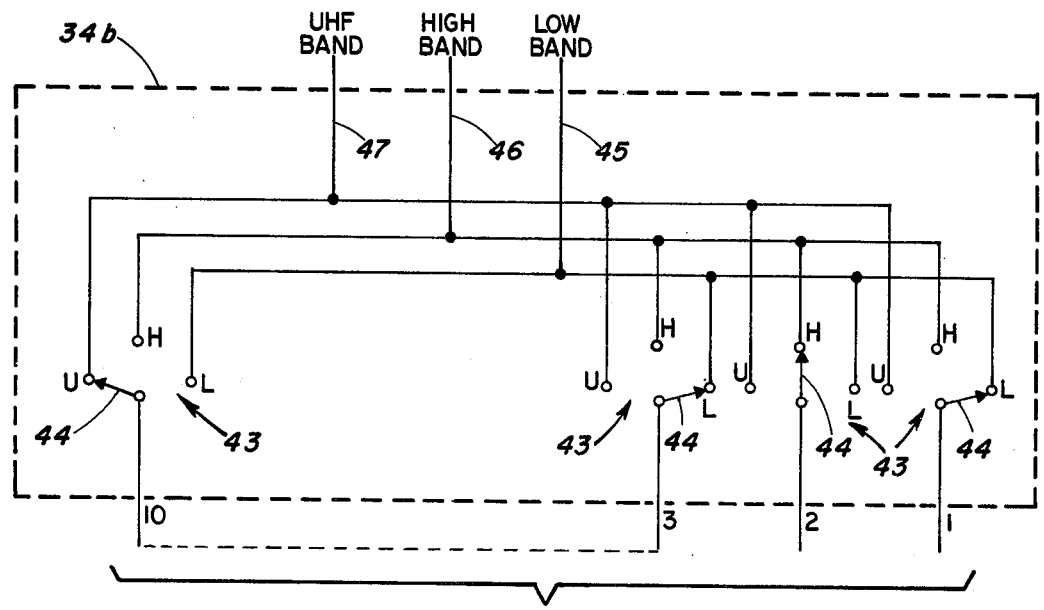
FIG. 4 is a schematic diagram of a third form of band-selecting means appropriate for use with the FIG. 1 radio receiver.

A third form for the band-selecting circuitry is shown by FIG. 4 and is identified as 34b. The arrangement differs somewhat from what has been described for band-selecting circuitry 34 and 34a. Band-selecting circuitry 34b includes a series of ten rotary switches 43 having, in this embodiment, three positions designated by terminals L, H and U. The center switch arm 44 of each switch 43 couples through diodes (not shown) to one of the ten outputs of stepping and locking circuit 30. Arm 44 is manually positionable to make electric contact with one of the three terminals. The terminal selected by arm 44 determines the band on which a particular channel will be placed. The L terminals are connected in parallel to the low band lead 45 which couples to low band RF amplifier 18 and low band mixer 19. Similarly, the H terminals are connected in parallel to high band lead 46 and the U terminals are connected in parallel to UHF band lead 47.

Figure 5:
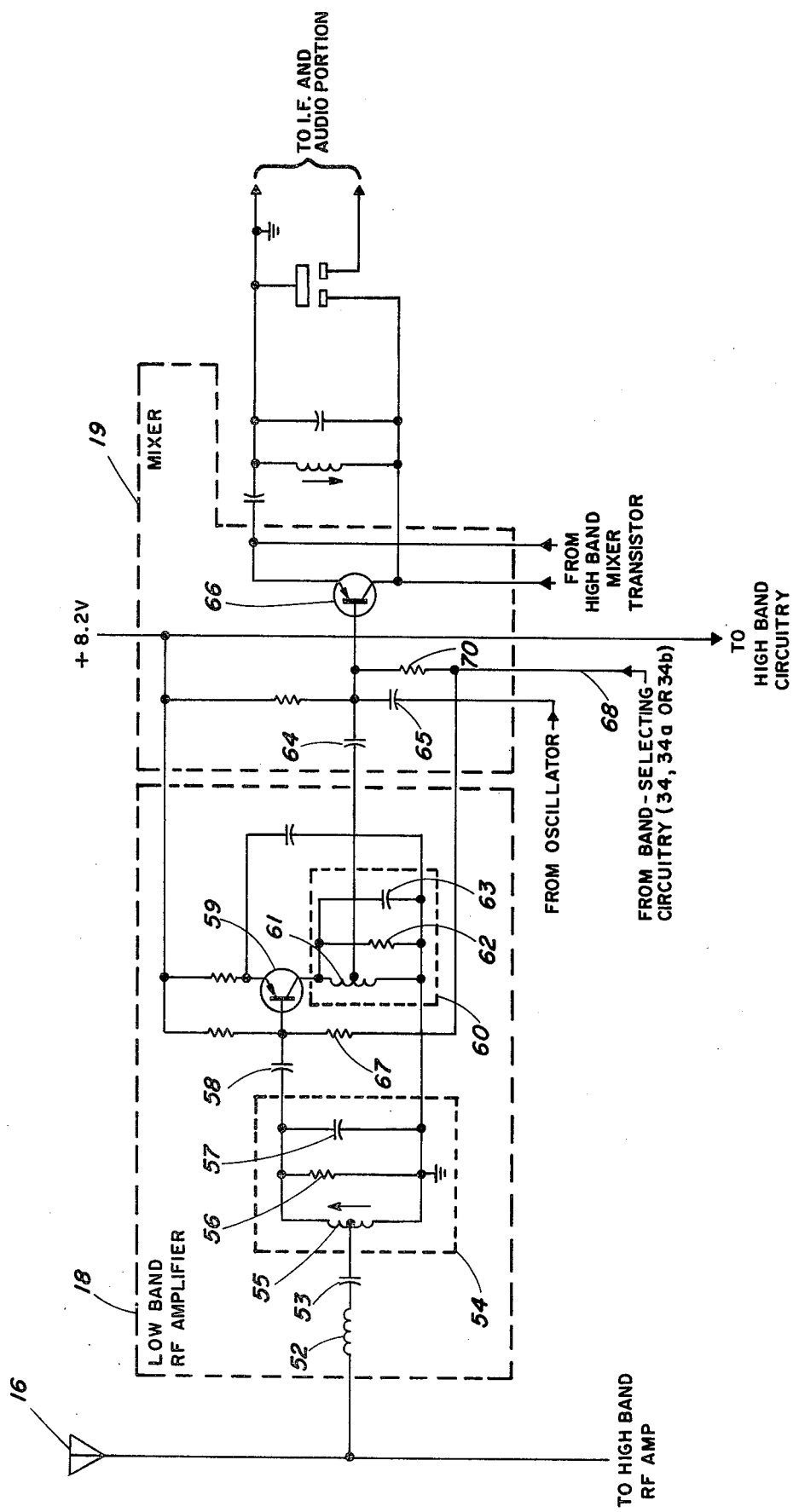
FIG. 5 is a circuit diagram of the low band RF amplifier and mixer circuits of FIG. 1.

Referring to FIG. 5, there is illustrated in detail circuitry of the low band RF amplifier 18 and mixer 19. The signal received on antenna 16 fed through a series LC circuit comprised of inductor 52 and capacitor 53 which serves to isolate high band frequencies from the remaining portion of the low band RF amplifier 18. The low band RF amplifier 18 includes a band pass filter circuit 54 which includes tapped inductor 55, resistor 56 and capacitor 57. The output from the bandpass filter circuit 54 is coupled through capacitor 58 to a PNP transistor 59 which amplifies RF signals. A second broad band, bandpass filter circuit 60 is present at the collector of transistor 59 and includes inductor 61, resistor 62 and capacitor 63. Amplified radio frequency signals from the low band RF amplifier 18 pass through capacitor 64 and mix with a signal from the local oscillators and channel indicator circuit 28 coupling through capacitor 65. Both signals are than mixed and amplified by PNP transistor 66 and associated circuitry to produce an IF signal which then connects to the IF and audio portion 11 of the receiver.

Line 68 from band-selecting circuitry 34 (or 34a or 34b) connected to the base terminal of transistors 59 and 66 through resistors 67 and 70, respectively. With the base and emitter of transistor 59 at equal potentials (8.2 volts) there is no current flow out of the collector and thus no RF signals from the RF amplifier 18 pass through capacitor 64. However, when a particular output of stepping and locking circuit 30 is "ON" (low impedance) and when the channel represented by this "ON" output is connected to the low band circuitry (by band-selecting circuitry 34, 34a or 34b), the base of transistor 59 will be biased such that the potential on the base drops below the 8.2 volt common supply potential on the emitter and the transistor conducts, thereby providing an emitter-base current path. Similarly, transistor 66 is also biased by the same output of circuit 30 being "ON," whereby transistor 66 conducts to produce an IF signal which connects to IF and audio portion 11 of the receiver.

Referring to FIG. 6, there is illustrated a high band RF amplifier 22 and mixer 23. The signal received on antenna 16 is spread through a series LC circuit comprised of inductor 74 and capacitor 75 which serves to isolate low band frequencies from the remaining portion of the high band RF amplifier 22. The high band RF amplifier 22 includes two broad band, bandpass filters 76 and 77. Filter 76 includes inductor 78, and capacitor 79 and filter 77 includes inductor 82, resistor 83 and capacitor 84.

Signals from antenna 16 couple through inductor 74 and capacitor 75, through filter 76 and then capacitor 85, through filter 77 and then through capacitor 88 to PNP amplifying transistor 89. A third bandpass filter 90 is present at the collector of transistor 89. Amplified radio frequency signals from the high band RF amplifier 22 pass through capacitor 91 and a mix with a signal coupling through capacitor 92 from the local oscillators and channel indicator circuit 28. Both signals are than mixed and amplified by transistor 95 and associated circuitry to produce an IF signal which then connects to the IF and audio portion 11 of the receiver.

Line 96 from band-selecting circuitry 34 or 34a or 34b connects to the base terminal of PNP transistors 89 and 95 through resistors 97 and 98, respectively. From this point on, the description of how the circuit responds to the outputs of the stepping and locking circuit 30 and the biasing of transistors 89 and 90 to provide an emitter-base current path is virtually the same as previously described for FIG. 5 and the low band portion.

Referring to FIG. 7, there is illustrated a UHF band RF amplifier 24 and mixer 25. UHF band RF amplifier 24 includes a relatively broad band, bandpass filter 103. This filter 103 includes an inductor 104, a variable capacitor 105 and a resistor 106. Signals received by antenna 17 are filtered by bandpass filter 103 and pass to field effect transistor 107 from which the signals out are filtered again by bandpass filter 108 which includes a resistor 111, a variable capacitor 112 and an inductor 113. Signals out from filter 108 are fed into mixer 25 through capacitor 114 and mix with a signal coupling through capacitor 115 from the local oscillators and channel indicator circuit 28. Both signals are then mixed and amplified by transistor 116 and associated circuitry to produce an IF signal which then connects to the IF and audio portion 11 of the receiver. The remainder of the amplifier 24 and mixer 25 operation is virtually the same as previously described for the low band and high band portions. As indicated in the drawings, the emitters of transistors 66, 95 and 116 are connected together and the collectors of transistors 66, 95 and 116 are connected together.

Figure 8:
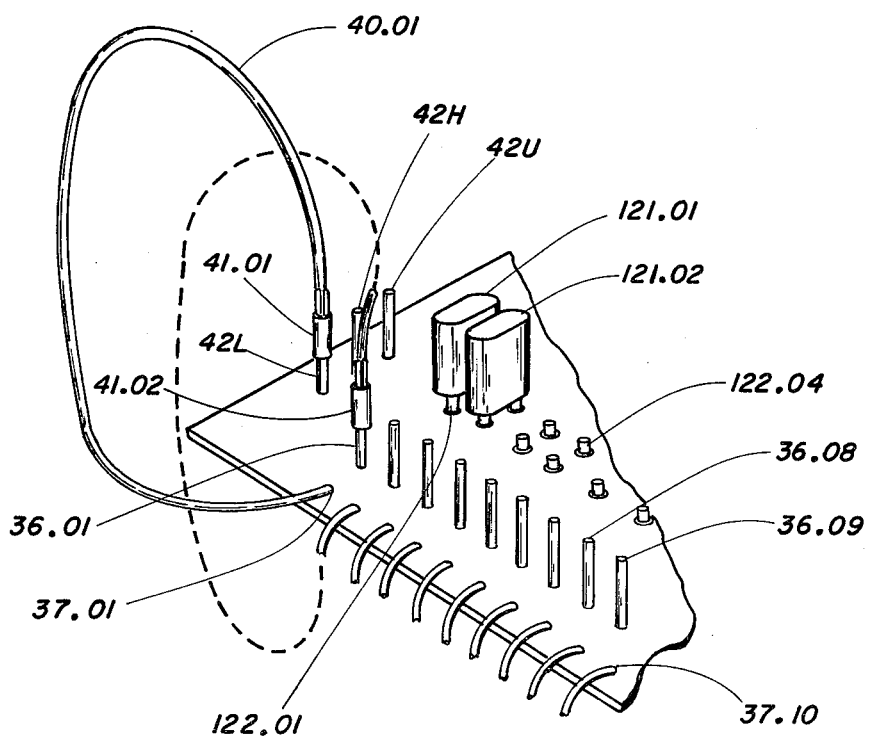
FIG. 8 is a pictorial illustration of a patch panel representative of the band-selecting means of FIG. 2.

Referring to FIG. 8, there is illustrated a programmable patchboard device 120 which is shown in circuit form by FIG. 2. This device 120 serves as a programmable, band-selecting means which connects to the various band RF amplifiers and mixers and to stepping and locking circuit 30. Patchboard device 120 functions to select the bands on which the various channels will operate. It can be observed from FIG. 8 that the location of the crystals (such as crystal 121.01) which control the reception of frequencies of the receiver are adjacent to pins 36.01 to 36.09 and wire ends 37.01 to 37.10. Therefore, in operation, a particular crystal for a given frequency is placed in a particular socket. Then the connector on the end of the wire corresponding to the channel position in which the crystal is placed is then connected to one of the three pins 42L, 42H or 42U which correspond to the band (frequency range) that the receiver is to receive on that channel. For example, if a 41 MHz frequency is desired to be heard on channel 1 of the receiver, a crystal 121.01 of the proper frequency for reception of a 41 MHz signal is placed in a crystal socket 122.01 adjacent the wire end 37.01 and pin 36.01 associated with channel 1. The connector 41.01 on the end of wire 40.01 is then mated with pin 42L.

If channel 2 is then to be made to operate to receive a frequency at 42 MHz, a crystal 121.02 is similarly placed adjacent to pin 36.02 and wire end 37.02. The connector 41.02 on the end of wire 40.02 is then connected to pin 36.01. Since channel 2 should also be programmed for the low band, and since channel 1 is already connected to the only pin permanently associated with the low band, it is necessary to connect the connector 41.02 to pin 36.01 to place the second channel on the same band. The same technique can be repeated if desired by placing connector 41.03 on pin 36.02 to place channel 3 also on the same band. This will enable, if desired, the receiver to operate with all ten channels on the same band.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. In a stepping radio receiver for production of audio signals from radio frequency signals and capable of tuning to several separate channels on a plurality of bands, which radio receiver includes:
   (a) a pre-IF section having an RF signal-receiving means, mixing means, and an oscillator means;
   (b) said pre-IF section being operable on a plurality of distinctive bands;
   (c) a power supply having a first and second common supply lead;
   (d) said RF signal-receiving means being for providing sufficient RF signal level for said mixing means;
   (e) said mixing means being coupled to the RF signal receiving means;
   (f) an audio detection means coupled to said mixer means for producing an audio signal when an RF signal is being received, said audio detection means including squelch means for preventing the production of an audio signal when an RF signal is not being received;
   (g) said oscillator means being coupled to said mixer means and operable at a given several frequencies, there being one frequency for each channel to which the receiver can tune;
   (h) stepping means which is defeatable and which has several outputs which are coupled to said oscillator means for stepping said oscillator means through said given several frequencies;
   (i) locking means which is connected to the stepping means for defeating said stepping means as long as an RF signal is being received and allowing resumption of operation of said stepping means when no signal is being received;
   (j) a programmable band-selecting means connected to the pre-IF section of the receiver and to the stepping means for determining the band of operation of the receiver;
   (k) said programmable band-selecting means including a plurality of enabling means, each enabling means being for enabling operation on one of the bands; the improvement which comprises:
   (l) said pre-IF section including a plurality of switchable transistor amplifiers which amplify pre-IF, RF signals, there being at least one of said switchable transistor amplifiers associated with each band;
   (m) said stepping means having means for producing a low impedance to said first common supply lead for the output which is "ON" and a high impedance or voltage with respect to said first common supply lead for the outputs which are "OFF", and
   (n) means connected with said programmable band-selecting means for providing a current path for one of said switchable transistor amplifiers which passes through the low impedance output of said stepping means, the selection of said one of said switchable transistor amplifiers being made by said programmable band-selecting means, said current path having the same current through both the stepping means outputs and said switchable transistor amplifiers.

2. The radio receiver of claim 1 in which each of said switchable transistor amplifiers includes a PNP transistor connected for radio frequency amplification.

3. The radio receiver of claim 2 in which said first common supply lead is a ground reference.

4. The radio receiver of claim 3 in which said current path is the emitter-base current path of said PNP transistor.

5. The radio receiver of claim 1 in which said switchable transistor amplifiers are part of the RF signal-receiving means circuitry.

6. The radio receiver of claim 5 in which each of said switchable transistor amplifiers includes a PNP transistor connected for radio frequency amplification.

7. The radio receiver of claim 6 in which said first common supply lead is at a ground reference.

8. The radio receiver of claim 7 in which said current path is the emitter-base current path of said PNP transistor.

9. The radio receiver of claim 8 in which each of said RF signal receiving means includes a plurality of RF amplifiers, there being one RF amplifier associated with each band.

10. The radio receiver of claim 9 in which said programmable band-selecting means comprises:
    (a) a first plurality of a first type of connecting element coupled to a respective one of the output of said stepping means; and
    (b) a second plurality of a second type of connecting elements which are of a design which permits them to mate with said first type of connecting elements, each connecting element of said second plurality coupling directly, regardless of any connection with a first type of connecting element, to the base terminal of a respective one of said PNP transistors.

11. The radio receiver of claim 1 in which said switchable transistor amplifiers are part of the mixer means circuitry.

12. The radio receiver of claim 11 in which each of said switchable transistor amplifiers include a PNP transistor connected for radio frequency amplification.

13. The radio receiver of claim 12 in which said common supply lead is at a ground reference.

14. The radio receiver of claim 13 in which said current path is the emitter-base current path of said PNP transistor.

15. The radio receiver of claim 14 in which each of said RF signal-receiving means includes a plurality of RF amplifiers, there being one RF amplifier associated with each band.

16. The radio receiver of claim 15 in which said programmable band-selecting means comprises:
    (a) a first plurality of a first type of connecting element coupled to a respective one of the outputs of said stepping means; and
    (b) a second plurality of a second type of connecting elements which are of a design which permits them to mate with said first type of connecting elements, each connecting element of said second plurality coupling directly, regardless of any connection with a first type of connecting element, to the base terminal of a respective one of said PNP transistors.

17. The radio receiver of claim 16 in which a plurality of wires couple the first type of connecting elements to said stepping means and which further includes a third plurality of said second type of connecting elements, distinct and separate from said second plurality, each element of said third plurality being:
    (a) electrically connected to a corresponding one of said wires regardless of any mating with a first type of connecting element and
    (b) coupled to a respective one of the outputs of said stepping means regardless of any mating with the first type of connecting element.

18. The radio receiver of claim 17 in which the oscillator means includes a plurality of crystals.

19. The radio receiver of claim 18 which additionally includes several diodes and in which each of said plurality of wires is coupled through a respective one of said diodes to a respective one of the outputs of said stepping means.

* * * * *